United States Patent
Furusho et al.

(10) Patent No.: US 9,372,405 B2
(45) Date of Patent: Jun. 21, 2016

(54) CHEMICAL LIQUID SUPPLY METHOD AND CHEMICAL LIQUID SUPPLY SYSTEM

(75) Inventors: Toshinobu Furusho, Koshi (JP); Takahiro Ookubo, Koshi (JP); Takashi Sasa, Koshi (JP); Tsuyoshi Nogami, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 470 days.

(21) Appl. No.: 13/351,284

(22) Filed: Jan. 17, 2012

(65) Prior Publication Data
US 2012/0181239 A1    Jul. 19, 2012

(30) Foreign Application Priority Data

Jan. 18, 2011  (JP) .................. 2011-007457

(51) Int. Cl.
*B01D 57/00* (2006.01)
*G03F 7/16* (2006.01)
*H01L 21/67* (2006.01)

(52) U.S. Cl.
CPC ............ *G03F 7/162* (2013.01); *H01L 21/6715* (2013.01); *H01L 21/67017* (2013.01)

(58) Field of Classification Search
CPC .... B01D 57/00; B01D 2221/14; B01D 35/02; B01D 35/1573; B01D 35/28; B01D 37/043; B01D 37/046; B05C 11/10; H01L 21/02; H01L 21/6715; B67D 7/58; B67D 7/36; G03F 7/00; G03F 7/162; F04B 1/06; F04B 43/073; F04B 35/045; F04B 43/00; F04B 43/03; F04B 43/04; F04B 9/00; F04B 9/02; F04B 9/08; F04B 9/06; F04B 9/065; F04B 9/16; F04B 9/18; F04B 2205/00; F04B 2205/04; F04B 2205/05; F04B 2205/07; F04B 2205/09
USPC ............... 210/808, 97, 87, 90, 739, 741, 258, 210/416.1, 767; 417/44.3, 43, 44.2, 313, 417/63, 278
See application file for complete search history.

(56) References Cited

U.S. PATENT DOCUMENTS

| | | | | |
|---|---|---|---|---|
| 5,167,837 | A * | 12/1992 | Snodgrass et al. ............ | 210/767 |
| 2007/0267065 | A1* | 11/2007 | Okumura et al. ............. | 137/208 |
| 2008/0221822 | A1* | 9/2008 | Laverdiere et al. ........... | 702/100 |

FOREIGN PATENT DOCUMENTS

JP     2007-110004 A    4/2007

OTHER PUBLICATIONS

Pressure and Hydrostatics, Inamdar, University of Delaware, Uploaded Feb. 2010.*
Measurement and Control of Complexity Effects in Branched Microchannel Flow Systems, Robert Andrew Hart, University of Texas Austin, 2012.*
Edited Specification with corrections.*

* cited by examiner

*Primary Examiner* — Lucas Stelling
*Assistant Examiner* — Rohit K Dewan
(74) *Attorney, Agent, or Firm* — Pearne & Gordon LLP

(57) ABSTRACT

The pressure sensor detects a pressure in the operation chamber when the first opening/closing valve is opened at a time of starting a replenishment of the chemical liquid into the chemical liquid pump. The flow rate sensor detects an exhaust flow rate exhausted from the operation chamber.

1 Claim, 7 Drawing Sheets

51 : DIAPHRAGM
52 : PUMP ROOM
53 : OPERATION ROOM
56a : MAIN PASSAGEWAY
56b : EXHAUST PASSAGEWAY
56c : PRESSURIZATION PASSAGEWAY

FIG. 7
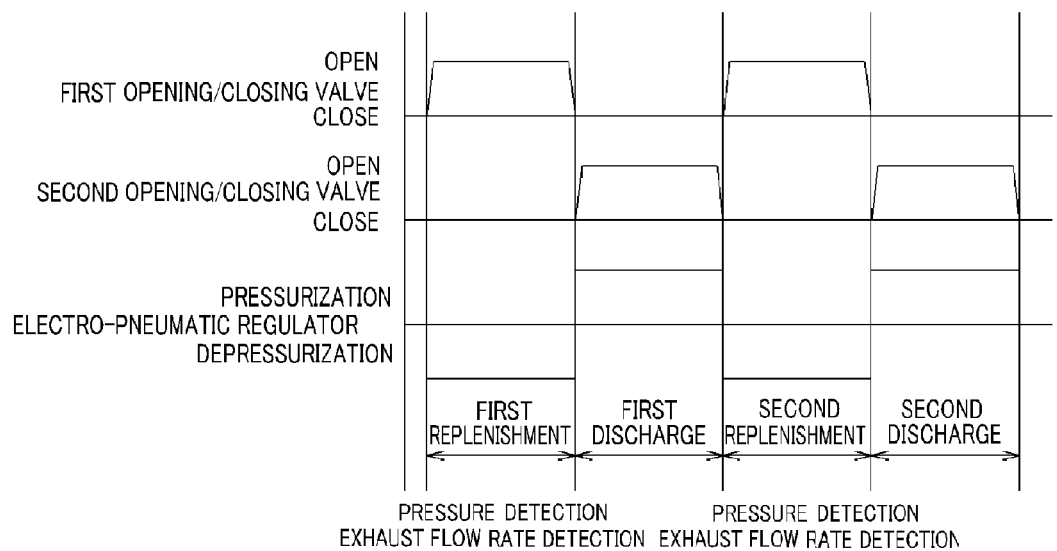
FIG. 8
(a) 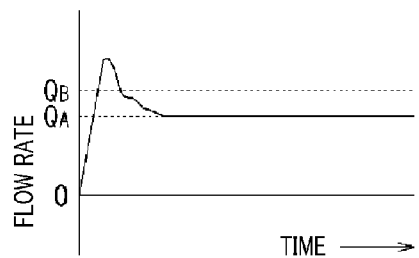
(b) 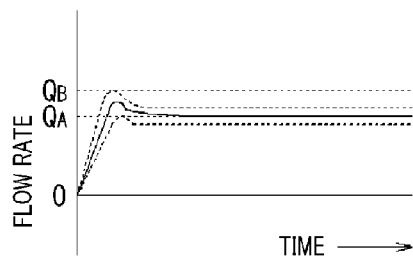

CHEMICAL LIQUID SUPPLY METHOD AND CHEMICAL LIQUID SUPPLY SYSTEM

CROSS-REFERENCE TO RELATED APPLICATION

This application claims the benefit of Japanese Patent Application No. 2011-007457 filed on Jan. 18, 2011, the entire disclosures of which are incorporated herein by reference.

FIELD OF THE INVENTION

The present disclosure relates to a chemical liquid supply method and a chemical liquid supply system.

BACKGROUND OF THE INVENTION

In a semiconductor fabricating process, a photolithography process has been employed. In the photolithography process, in order to form a desired circuit pattern, a resist film is formed on a substrate such as a semiconductor wafer by coating the substrate with photoresist, and the resist film is exposed to light by using a certain circuit pattern and is developed. In general, the photolithography process is performed by a processing system in which an exposure apparatus is connected to a coating and developing apparatus.

In the photolithography process, there has been generally known a spin coating method of forming the resist film onto a surface of the substrate through centrifugal force by supplying a resist solution as a chemical liquid onto a central portion of the surface of the substrate while spinning the substrate about a vertical axis thereof. In the spin coating method, in order to supply a certain amount of resist solution onto the surface of the substrate, a chemical liquid supply method (system) using a constant pressure pump has been employed.

In the conventional spin coating method, there has been known a chemical liquid supply system (see, for example, Patent Document 1). This chemical liquid supply system includes a chemical liquid passageway; a chemical liquid pump; an operation gas supply device; a first opening/closing valve and a second opening/closing valve. The chemical liquid passageway connects a chemical liquid tank for storing therein a resist solution and a chemical liquid discharge nozzle. The chemical liquid pump, the operation gas supply device, the first opening/closing valve and the second opening/closing valve are provided on the chemical liquid passageway. The chemical liquid pump is partitioned into a pump chamber and an operation chamber by a flexible member. Here, a volume of the pump chamber is varied depending on the change in internal pressure of the operation chamber. With this configuration, the chemical liquid pump performs suction or discharge of a chemical liquid (resist solution) according to the volume change of the pump chamber. The operation gas supply device supplies an operation gas into the operation chamber of the chemical liquid pump while adjusting the pressure thereof. The first opening/closing valve and the second opening/closing valve are respectively provided at a first side and a second side of the chemical liquid pump on the chemical liquid passageway. With this valve configuration, a pressure value of the operation gas supplied from the operation gas supply device is detected, and the pressure value of the operation gas is set depending on types of chemical liquids or other conditions. Then, the chemical liquid supply system controls the discharge flow rate of the chemical liquid by using the detected pressure value and the set pressure value.

In this chemical liquid supply system, in order to prevent introduction of impurities into the resist solution to be discharged, a filter is provided at the first side of the chemical liquid pump on the chemical liquid passageway.

Patent Document 1: Japanese Patent Laid-open Publication No. 2007-110004 (Claims)

Patent Document 1 describes that the pressure value of the operation gas is detected when the operation gas is supplied from the operation gas supply device, and the discharge flow rate of the chemical liquid is controlled based on the detected pressure value and the previously set pressure value. Patent Document 1, however, does not disclose anything about the control of an exhaust pressure (exhaust flow rate) of the operation gas when the chemical liquid is sucked in by the chemical liquid pump, that is, when the chemical liquid is replenished.

In Patent Document 1, when the chemical liquid is replenished to the pump chamber of the chemical liquid pump after discharging the previously supplied chemical liquid, if the first opening/closing valve is opened and the operation gas in the operation chamber is exhausted, there is generated a pressure difference between an upstream side and a downstream side of the first opening/closing valve, i.e., between the pump chamber and the operation chamber. As a result, excessive pressure fluctuation, i.e., overshoot occurs when the replenishment of the chemical liquid is started. This is also caused by variation of an amount of the chemical liquid remaining in the chemical liquid tank. The overshoot that occurs when starting the replenishment of the chemical liquid into the chemical liquid pump is a common problem in a chemical liquid supply system using a fixed-quantity pump.

Once the overshoot occurs, a flow rate of the chemical liquid replenished into the pump chamber of the chemical liquid pump increases, and a flow rate thereof also becomes faster. Accordingly, a filtering rate of the filter also increases, and there is a concern that impurities or foreign substances in the chemical liquid pass through the filter without being filtered. Further, while the chemical liquid containing impurities passes through the chemical liquid pump and reaches a chemical liquid discharge unit after passing through the filter, particles may be generated and discharged from the chemical liquid discharge unit onto a surface to be coated with chemical liquid. Especially, under the recent trend, there is a tendency to reduce a discharge amount of resist. Accordingly, in order to meet demand for the small discharge amount of resist, the filtering rate of the filter needs to be precisely controlled. In this regard, an adverse effect resulting from the overshoot may not be overlooked.

BRIEF SUMMARY OF THE INVENTION

In view of the foregoing, illustrative embodiments provide a chemical liquid supply method and a chemical liquid supply system, capable of maintaining a filtering accuracy by suppressing excessive pressure fluctuation chemical liquid and controlling a filtering rate of a filter, when replenishment of a chemical liquid is started.

In accordance with one aspect of an illustrative embodiment, there is provided a chemical liquid supply method performed by a chemical liquid supply system. The chemical liquid supply system includes a filter for filtering a chemical liquid; a chemical liquid pump, for performing suction and discharge of the chemical liquid according to a volume change of a pump chamber caused by a pressure change in an operation chamber partitioned by a flexible member from the pump chamber; a first opening/closing valve provided at a first side of the chemical liquid pump; and a second opening/closing valve provided at a second side of the chemical liquid pump. Here, the filter, the chemical liquid pump, the first opening/closing valve and the second opening/closing valve may be provided on a chemical liquid passageway for connecting a chemical liquid discharge unit and a chemical liquid tank storing therein the chemical liquid. Further, the chemical liquid supplied from the chemical liquid tank may be filtered by the filter according to opening/closing operations of the first and second opening/closing valves and a supply/exhaust operation of the chemical liquid pump, and then, the chemical liquid may be discharged from the chemical liquid discharge unit. In this chemical liquid supply system, the chemical liquid supply method includes detecting a pressure in the operation chamber and an exhaust flow rate exhausted from the operation chamber when the first opening/closing valve is opened at a time of starting a replenishment of the chemical liquid into the chemical liquid pump; and adjusting an exhaust pressure based on the detected pressure and the detected exhaust flow rate so as not to cause an excessive pressure change when the replenishment of the chemical liquid is started. Here, adjusting an exhaust pressure may be performed by a pressure adjustment unit provided in a passage connecting the operation chamber and a depressurization source.

Further, in the chemical liquid supply method, a compensated pressure may be calculated based on the detected pressure and a pressure varying depending on an arrangement position of the chemical liquid tank and a liquid surface position of the chemical liquid in the chemical liquid tank. Further, the exhaust pressure may be adjusted based on the compensated pressure and the exhaust flow rate so as not to cause an excessive pressure change when the replenishment of the chemical liquid is started.

In accordance with another aspect of an illustrative embodiment, there is provided a chemical liquid supply system configured to perform the chemical liquid supply method. The chemical liquid supply system includes: a filter for filtering a chemical liquid; a chemical liquid pump, for performing suction and discharge of the chemical liquid according to a volume change of a pump chamber caused by a pressure change in an operation chamber partitioned by a flexible member from the pump chamber; a first opening/closing valve provided at a first side of the chemical liquid pump; a second opening/closing valve provided at a second side of the chemical liquid pump; a pressure sensor for detecting a pressure in the operation chamber; a flow rate sensor for detecting an exhaust flow rate; a first pressure adjustment unit for adjusting an exhaust pressure; and a controller for controlling the first pressure adjustment unit based on detected signals from the pressure sensor and the flow rate sensor. Here, the filter, the chemical liquid pump, the first opening/closing valve and the second opening/closing valve may be provided on a chemical liquid passageway for connecting a chemical liquid discharge unit and a chemical liquid tank storing therein the chemical liquid. Further, the chemical liquid supplied from the chemical liquid tank may be filtered by the filter according to opening/closing operations of the first and second opening/closing valves and a supply/exhaust operation of the chemical liquid pump, and then, the chemical liquid may be discharged from the chemical liquid discharge unit. Further, the pressure sensor, the flow rate sensor and the first pressure adjustment unit may be provided on a passage connected to the operation chamber of the chemical liquid pump. The pressure sensor may detect a pressure in the operation chamber when the first opening/closing valve is opened at a time of starting a replenishment of the chemical liquid into the chemical liquid pump. The flow rate sensor may detect an exhaust flow rate exhausted from the operation chamber. The controller may adjust an exhaust pressure by controlling the first pressure adjustment unit based on the detected pressure and the detected exhaust flow rate so as not to cause an excessive pressure change when the replenishment of the chemical liquid is started.

Here, the passage may include a main passage connected to the operation chamber of the chemical liquid pump, an exhaust passage branched from the main passage and connected to a depressurization source, and a pressurization passage branched from the main passage and connected to a pressurization source. Further, the flow rate sensor may be provided on the main passage, the first pressure adjustment unit may be provided on the exhaust passage, and a second pressure adjustment unit may be provided on the pressurization passage. The first pressure adjustment unit and the second pressure adjustment unit may be combined to each other as a combined pressure adjustment unit, and the pressure sensor may be provided in the combined pressure adjustment unit. The controller may be configured to control an exhaust pressure and a pressing pressure of the combined pressure adjustment unit.

In the chemical liquid supply system, the controller may calculate a compensated pressure based on the detected pressure and a pressure varying depending on an arrangement position of the chemical liquid tank and a liquid surface position of the chemical liquid in the chemical liquid tank. Further, the controller may adjust an exhaust pressure based on the compensated pressure and the exhaust flow rate so as not to cause an excessive pressure change when the replenishment of the chemical liquid is started.

In accordance with an illustrative embodiment, the pressure in the operation chamber and the exhaust flow rate exhausted from the operation chamber are detected when the first opening/closing valve is opened at the time of starting the replenishment of the chemical liquid into the chemical liquid pump. Accordingly, the volume changes of the operation chamber and the pump chamber, that is, a volume change amount of the chemical liquid pump can be calculated based on the exhaust flow rate exhausted (discharged) from the operation chamber and the flow rate in the operation chamber caused by the pressure change. In this way, the pressure change of the chemical liquid can be checked when the replenishment is started. Further, by controlling a driving pressure of the pressure adjustment unit based on the detected pressure and the detected exhaust flow rate, an exhaust pressure can be adjusted so as not to cause the excessive pressure change when the replenishment of the chemical liquid is started. As a result, a replenishment rate of the chemical liquid can be controlled.

In accordance with an illustrative embodiment, a compensated pressure is calculated based on the detected pressure and a pressure varying depending on the arrangement position of the chemical liquid tank and the liquid surface position of the chemical liquid in the chemical liquid tank. Further, the exhaust pressure is adjusted based on the compensated pressure and the exhaust flow rate exhausted from the operation chamber so as not to cause the excessive pressure change when the replenishment of the chemical liquid is started. Accordingly, the exhaust pressure can be adjusted so as not to cause the excessive pressure change when the replenishment of the chemical liquid is started although the pressure at the first side of the chemical liquid pump varies as time passes according to the multiple number of the chemical liquid discharge in the chemical liquid supply system.

In accordance with an illustrative embodiment, by controlling the driving pressure of the pressure adjustment unit based on the pressure and the exhaust flow rate detected when the replenishment of the chemical liquid is started, the exhaust pressure can be adjusted so as not to cause the excessive pressure change when the replenishment of the chemical liquid is started. Accordingly, the replenishment rate of the chemical liquid can be controlled. As a result, it is possible to maintain the filtering accuracy of the filter by controlling the filtering rate of the filter when the replenishment of the chemical liquid is started.

In accordance with an illustrative embodiment, the exhaust pressure can be adjusted so as not to cause the excessive pressure change when the replenishment of the chemical liquid is started although the pressure at the first side of the chemical liquid pump varies as time passes according to the multiple number of the chemical liquid discharge in the chemical liquid supply system. Accordingly, it is also possible to further improve the filtering accuracy of the filter as well as to maintain the filtering accuracy of the filter.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 7 is a time chart illustrating a chemical liquid replenishing and discharging operations in accordance with an illustrative embodiment; and FIG. 8 provides a graph (a) showing a relationship between a flow rate of a chemical liquid and time during first replenishment and a graph (b) showing a relationship between a flow rate of the chemical liquid and time during second replenishment.

DETAILED DESCRIPTION OF THE INVENTION

Figure 1:
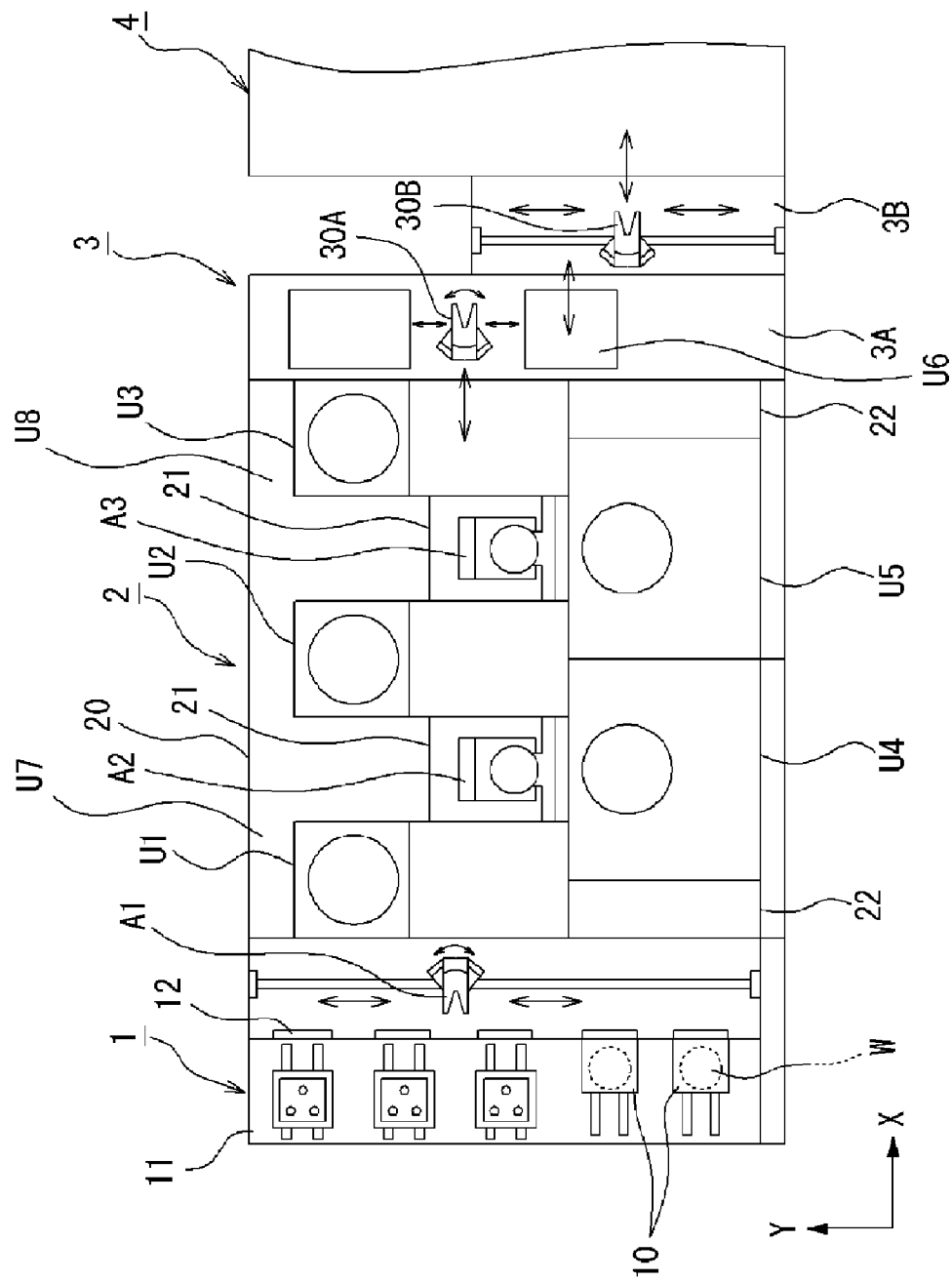
FIG. 1 is a schematic plane view of an entire processing system in which an exposure apparatus is connected to a coating and developing apparatus having a chemical liquid supply system in accordance with an illustrative embodiment.

Hereinafter, illustrative embodiments will be described in detail with reference to the accompanying drawings. Herein, there will be explained a processing system in which an exposure apparatus is connected to a coating and developing apparatus having a chemical liquid supply system in accordance an illustrative embodiment.

The processing system includes a carrier station 1, a processing unit 2, an exposure apparatus 4 and an interface unit 3. The carrier station 1 is configured to load and unload carriers 10 hermetically accommodating therein a multiple number of, e.g., 25 semiconductor wafers W as target substrates. The processing unit 2 is configured to perform a resist coating and developing process onto the wafer W taken out of the carrier station 1. The exposure apparatus 4 is configured to expose surfaces of the wafer W to light. The interface unit 3 is provided between the processing unit 2 and the exposure apparatus 4 to transfer the wafer W.

The carrier station 1 includes a mounting unit 11, an opening/closing unit 12 and a transfer device A1. A multiple number of carriers 10 are arranged and mounted on the mounting unit 11. The opening/closing unit 12 is provided on a front wall surface of the carrier station 1 when viewed from the mounting unit 11. The transfer device A1 is configured to take the wafer W out of the carrier 10 through the opening/closing unit 12.

The processing unit 2 surrounded by a housing 20 is connected to a side of the carrier station 1. In the processing unit 2, shelf units U1, U2 and U3 and liquid processing units U4 and U5 are provided. The shelf units U1, U2 and U3 are arranged in this order from the left front side of the processing unit 2 when viewed from the carrier station 1. In each of the shelf units U1, U2 and U3, heating units and cooling units are stacked in multi-layers. The liquid processing units U4 and U5 are arranged at the right side of the processing unit 2 when viewed from the carrier station 1. Main transfer devices A2 and A3 for transferring the wafers W between the self units U1, U2 and U3 are provided between the shelf units U1, U2 and U3. Here, the transfer devices A2 and A3 and the shelf units U1, U2 and U3 are arranged alternately. Each of the main transfer devices A2 and A3 is positioned in a space surrounded by partition walls 21. Here, when viewed from the carrier station 1, the partition walls 21 include: surfaces of the shelf units U1, U2 and U3 positioned in the front and rear sides; surfaces of the liquid processing units U4 and U5 positioned in the right side; and surfaces in the left side. Temperature and humidity control units 22 are provided between the carrier station 1 and the processing unit 2 and between the processing unit 2 and the interface unit 3, respectively. Each temperature and humidity control unit 22 includes a temperature control device or a temperature and humidity control duct for a processing solution used in each of the units.

The interface unit 3 includes a first transfer chamber 3A and a second transfer chamber 3B provided in a forward and backward direction between the processing unit 2 and the exposure apparatus 4. A first wafer transfer device 30A and a second wafer transfer device 30B are provided in the first transfer chamber 3A and the second transfer chamber 3B, respectively.

Figure 2:
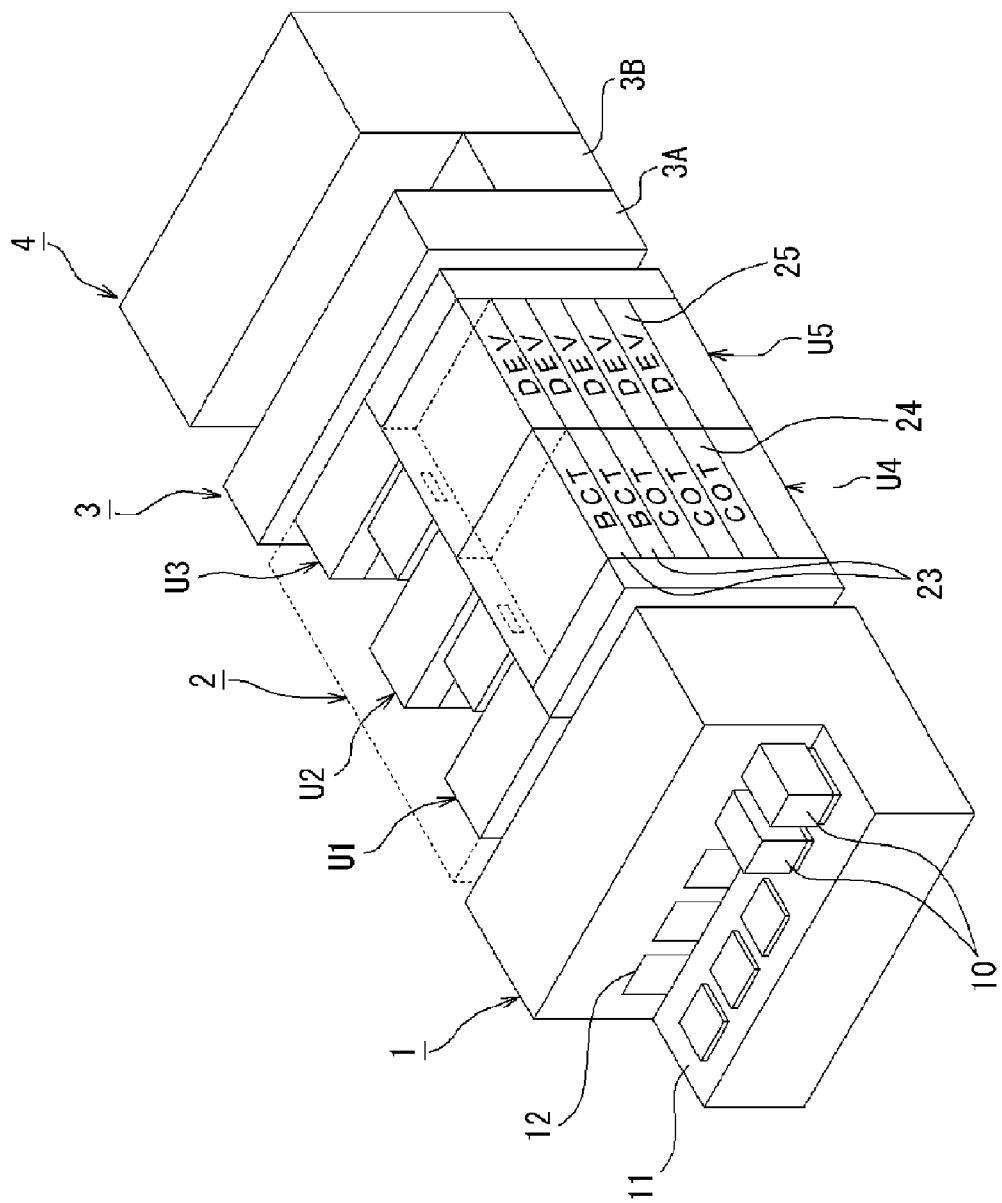
FIG. 2 is a schematic perspective view of the processing system.

In each of the shelf units U1, U2, and U3, various units for performing pre-treatment and post-treatment performed in the liquid processing units U4 and U5 are stacked in multiple, for example, 10 layers. Such various units include a heating unit (HP) for heating (baking) the wafer W, a cooling unit (CPL) for cooling the wafer W, and so forth. Further, as illustrated in FIG. 2, in the liquid processing unit U4, bottom antireflection film coating units (BCT) 23 for coating an antireflection film and coating units (COT) 24 are stacked in multiple, for example, 5 layers on a chemical liquid storage unit for storing therein a resist or a development solution. In the liquid processing unit U5, developing units (DEV) 25 for developing the wafers W by supplying a development solution onto the wafers W are staked in multiple, for example, 5 layers. The chemical liquid supply system in accordance with the illustrative embodiment is provided in the coating unit (COT) 24.

Figure 3:
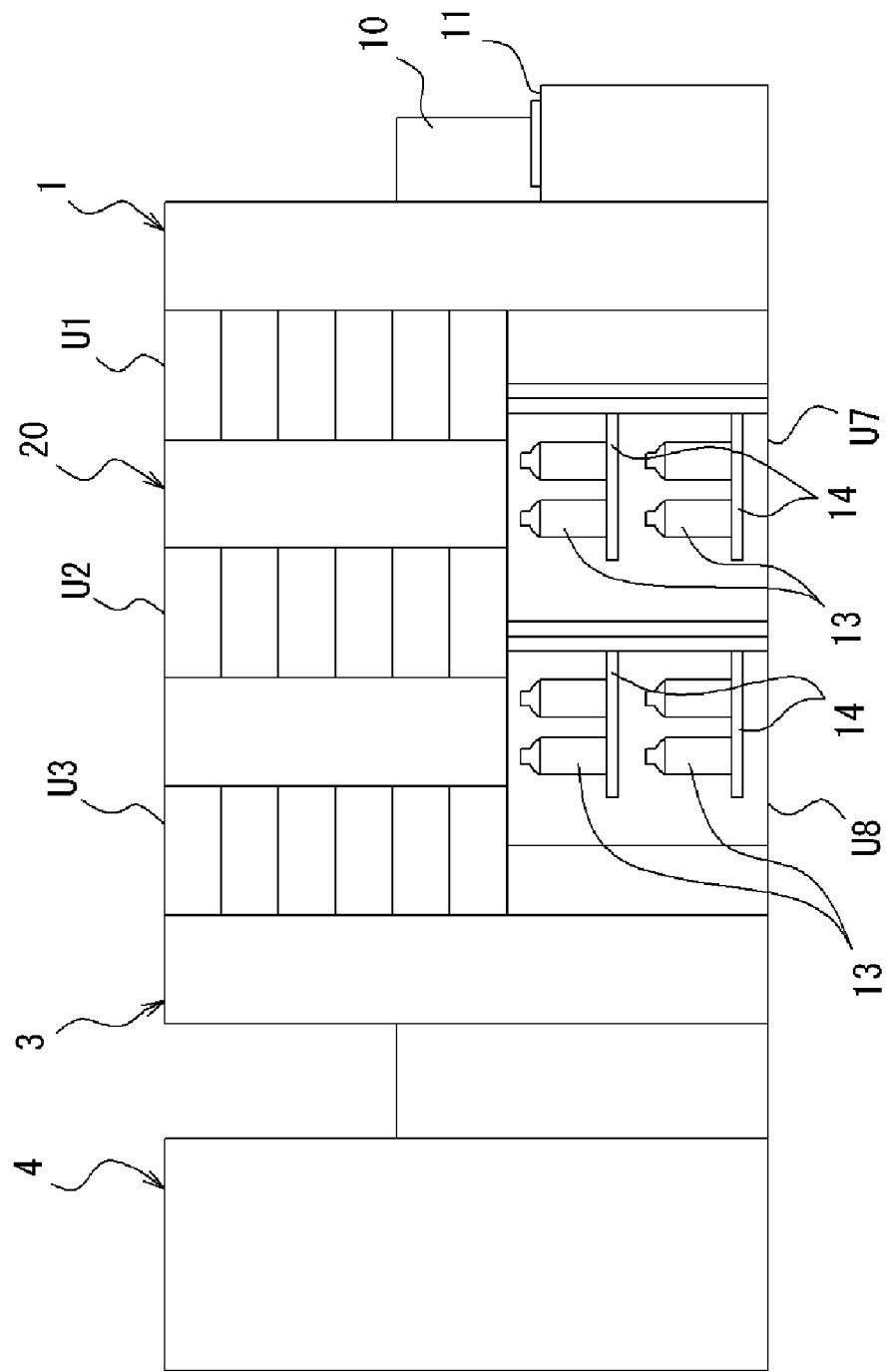
FIG. 3 is a schematic rear view of the processing system.

As illustrated in FIG. 3, chemical units U7 and U8 are provided in parallel below the shelf units U1 to U3. Each of the chemical units U7 and U8 includes mounting shelves 14 for mounting thereon chemical liquid bottles 13. The chemical liquid bottles 13 serve as chemical liquid tanks storing therein chemical liquids used in the chemical liquid supply system in accordance with the illustrative embodiment. The mounting shelves 14 can be moved up and down by a non-illustrated lifting mechanism.

Now, a transfer route of the wafer W in the above-described processing system will be briefly described. First, if the carrier 10 containing therein the wafers W is mounted on the mounting unit 11 from the outside, a cover body of the carrier 10 and the opening/closing unit 12 are opened, and the wafer W is taken out by the transfer device A1 from the carrier 10. Then, the wafer W is transferred onto the main transfer device A2 via a transit unit as one layer of the shelf unit U1. In one shelf within the shelf unit U1 or U2, an antireflection film formation or a wafer temperature control by the cooling unit is performed as a pre-process for a coating process.

Thereafter, the wafer W is loaded into the coating unit (COT) 24 by the main transfer device A2, and a resist film is formed on a surface of the wafer W. The wafer W having thereon the resist film is unloaded toward the outside by the main transfer device A2. Then, the wafer W is loaded into the heating unit, and a baking process is performed on the wafer W at a certain temperature. Upon the completion of the baking process, the wafer W is cooled in the cooling unit, and then loaded into the interface unit 3 via the transit unit of the shelf unit U3. Thereafter, the wafer W is loaded into the exposure apparatus 4 from the interface unit 3. Meanwhile, if a protection film for liquid immersion lithography on the resist film is formed, the wafer W is coated with a chemical liquid for the protection film in a non-illustrated unit of the processing unit 2 after the wafer W is cooled in the cooling unit. Thereafter, the wafer W is loaded into the exposure apparatus 4, and an exposure process is performed on the wafer W.

Upon the completion of the exposure process, the wafer W is taken out from the exposure apparatus 4 by the second wafer transfer device 30B and carried into the heating unit (PEB) serving as one layer of the shelf unit U6. Thereafter, the wafer W is taken out from the heating unit (PEB) by the first wafer transfer device 30A and transferred onto the main transfer device A3. The wafer W is then carried into the developing unit 25 by the main transfer device A3. In the developing unit 25, the wafer W is developed by a cleaning device also used for the developing process, and, then, the wafer W is additionally cleaned by the cleaning device. Thereafter, the wafer W is taken out from the developing unit 25 by the main transfer device A3, and returned into the carrier 10 on the mounting unit 11 via the main transfer device A2 and the transfer device A1.

Figure 4:
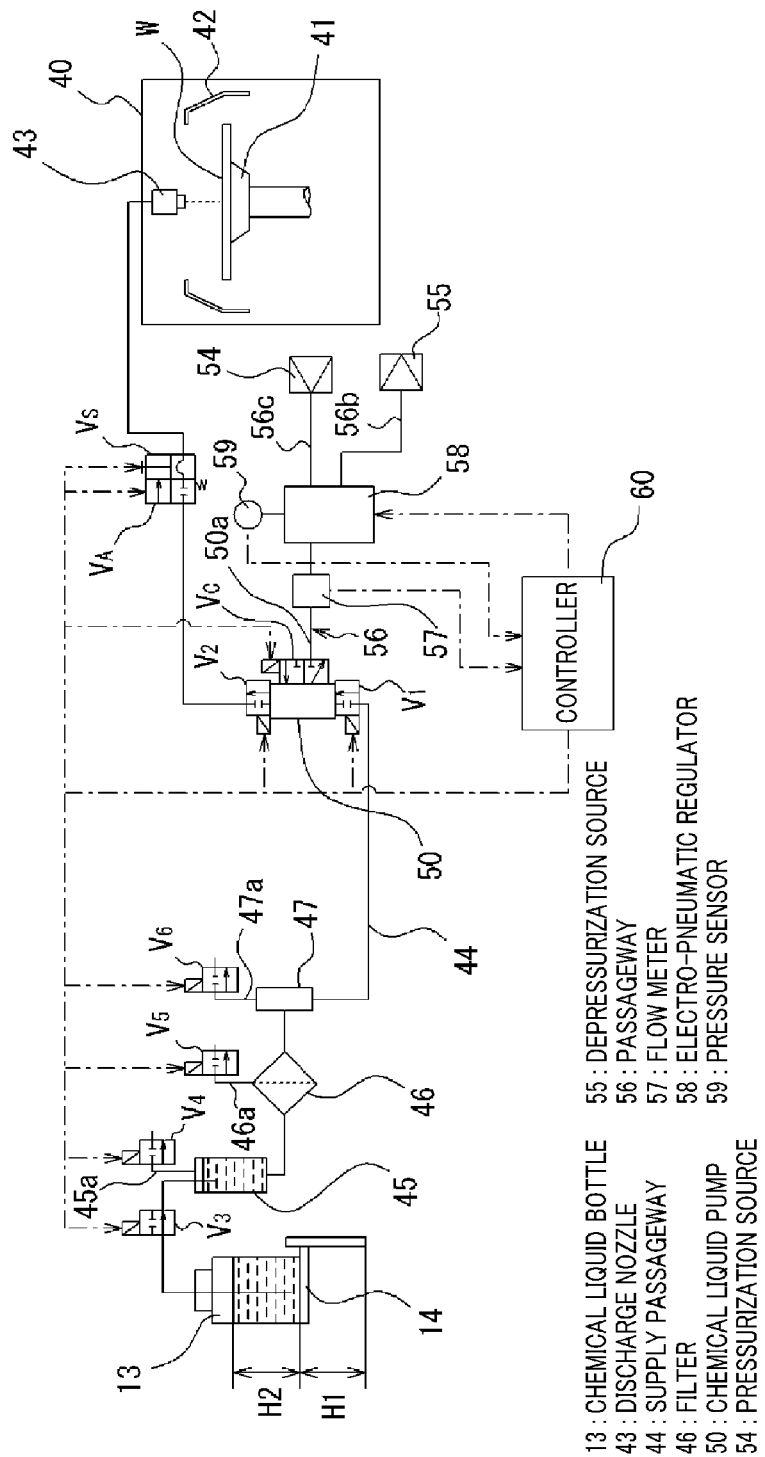
FIG. 4 is a schematic configuration view illustrating an embodiment of a chemical liquid supply system in accordance with an illustrative embodiment.

Subsequently, the chemical liquid supply system in accordance with an illustrative embodiment will be described by reference to FIGS. 4 to 6. Hereinafter, the coating unit (COT) 24 using the chemical liquid supply system in accordance with the illustrative embodiment will be described.

The coating unit (COT) 24 includes a casing 40; a spin chuck 41; a cup 42; and a chemical liquid discharge nozzle 43 (hereinafter, referred to as a "discharge nozzle 43") are provided. The spin chuck 41, the cup 42 and the chemical liquid discharge nozzle 43 are disposed in the casing 40. The spin chuck 41 holds thereon the wafer W horizontally and is configured to spin the wafer W about a vertical axis. The cup 42 surrounds the spin chuck 41, a periphery of the wafer W and a space below them. The discharge nozzle 43 discharges (supplies) the resist solution as the chemical liquid onto the surface of the wafer W held on the spin chuck 41.

The discharge nozzle 43 is connected to the chemical liquid bottle 13 via a supply passageway 44. On the supply passageway 44, a reservoir tank 45, a filter 46, a trap tank and a chemical liquid pump 50 are provided in this sequence from the side of the chemical liquid bottle 13. The reservoir tank 45 temporarily stores therein the chemical liquid, i.e. resist solution, supplied from the chemical liquid bottle 13. The filter 46 serves to filter impurities in the resist solution, and the trap tank 47 temporarily stores therein the resist solution that has passed through the filter 46. The chemical liquid pump 50 is provided between the trap tank 47 and the discharge nozzle 43 via a first opening/closing valve $V_1$ and a second opening/closing valve $V_2$, respectively.

An opening/closing valve $V_3$ is provided between the chemical liquid bottle 13 and the reservoir tank 45. An opening/closing valve $V_4$ for waste liquid is provided on a waste liquid passageway 45a connected to a top of the reservoir tank 45. A bubble discharge passageway 46a is connected to a top of the filter 46 via an opening/closing valve $V_5$. A waste liquid passageway 47a is connected to a top of the trap tank 47 via an opening/closing valve $V_6$. An air operation valve $V_A$ and a suck-back valve $V_S$ are provided between the chemical liquid pump 50 and the discharge nozzle 43.

Figure 5:
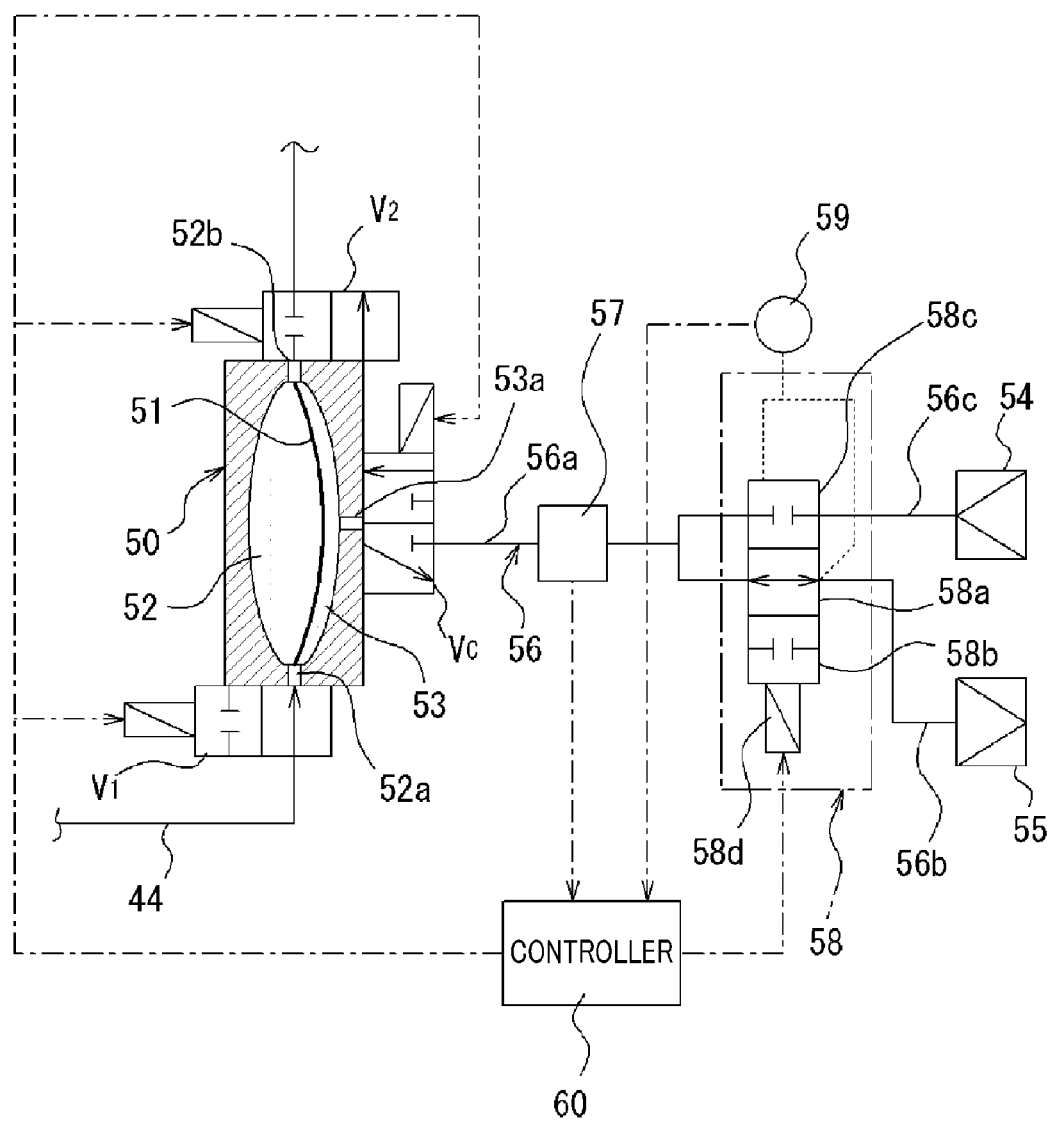
FIG. 5 is a general configuration view illustrating major parts of the chemical liquid supply system in accordance with an illustrative embodiment.

As illustrated in FIG. 5, the chemical liquid pump 50 is partitioned into a pump chamber 52 and an operation chamber 53 by a diaphragm 51 as a flexible member. The pump chamber 52 is provided with a first communication passage 52a and a second communication passage 52b. The first communication passage 52a is connected with the chemical liquid bottle 13 via the first opening/closing valve $V_1$, and the second communication passage 52b is connected to the discharge nozzle 43 via the second opening/closing valve $V_2$. The operation chamber 53 is provided with a supply/exhaust passage 53a communicating with the operation chamber 53. The supply/exhaust passage 53a is connected with a passageway 56 that is selectively connected to an air pressurization source 54 (hereinafter, referred to as a "pressurization source 54") or a depressurization source 55 via a supply-exhaust switching valve $V_C$. In this case, the passageway 56 includes a main passageway 56a, an exhaust passageway 56b and a pressurization passageway 56c. The main passageway 56a is connected to the operation chamber 53, and the exhaust passageway 56b and the pressurization passageway 56c branched from the main passageway 56a are connected to the depressurization source 55 and the pressurization source 54, respectively. A flow meter 57 as a flow rate sensor is provided on the main passageway 56a. A combined pressure adjustment unit 58 includes a pressure adjustment unit (58a and 58b) provided on the exhaust passageway 56b to adjust an exhaust pressure and a pressure adjustment unit (58a and 58c) provided on the pressurization passageway 56c to adjust pressurization, i.e. an air pressure. In this case, the combined pressure adjustment unit 58 includes a common communication block 58a, two stop blocks 58b and 58c, and an electromagnetic switching unit 58d, and is configured to serve as an electro-pneumatic regulator. The common communication block 58a is selectively connected with the exhaust passageway 56b or the pressurization passageway 56c. The two stop blocks 58b and 58c blocks communication between the main passageway 56a and the exhaust passageway 56b or communication between the main passageway 56a and the pressurization passageway 56c. The electromagnetic switching unit 58d controls a switching operation between the common communication block 58a and the two stop blocks 58b and 58c. The combined pressure adjustment unit 58 (hereinafter, referred to as the "electro-pneumatic regulator 58") is provided with a pressure sensor 59, and an internal pressure of the operation chamber 53 connected to the passageway 56 is detected by the pressure sensor 59.

In an operation gas supplying and exhausting unit connected to the operation chamber 53 of the chemical liquid pump 50 configured as described above, the flow meter 57, the pressure sensor 59, and the electro-pneumatic regulator 58 are electrically connected to a controller 60. An exhaust flow rate value in the passageway 56 detected by the flow meter 57 and a pressure value in the passageway 56 detected by the pressure sensor 59 are sent (inputted) to the controller 60. A control signal from the controller 60 is sent (outputted) to the electro-pneumatic regulator 58.

In addition to the electro-pneumatic regulator 58, opening/closing operations of the first opening/closing valve $V_1$, the second opening/closing valve $V_2$, the opening/closing valves $V_3$ to $V_6$, the air operation valve $V_A$, the suck-back valve $V_S$, and the supply-exhaust switching valve $V_C$ are also controlled by the controller 60. The controller 60 includes a central processing unit (CPU), programs, a memory, or the like. Now, functions of the chemical liquid supply system in accordance with an illustrative embodiment will be described as block components with reference to FIG. 6.

Figure 6:
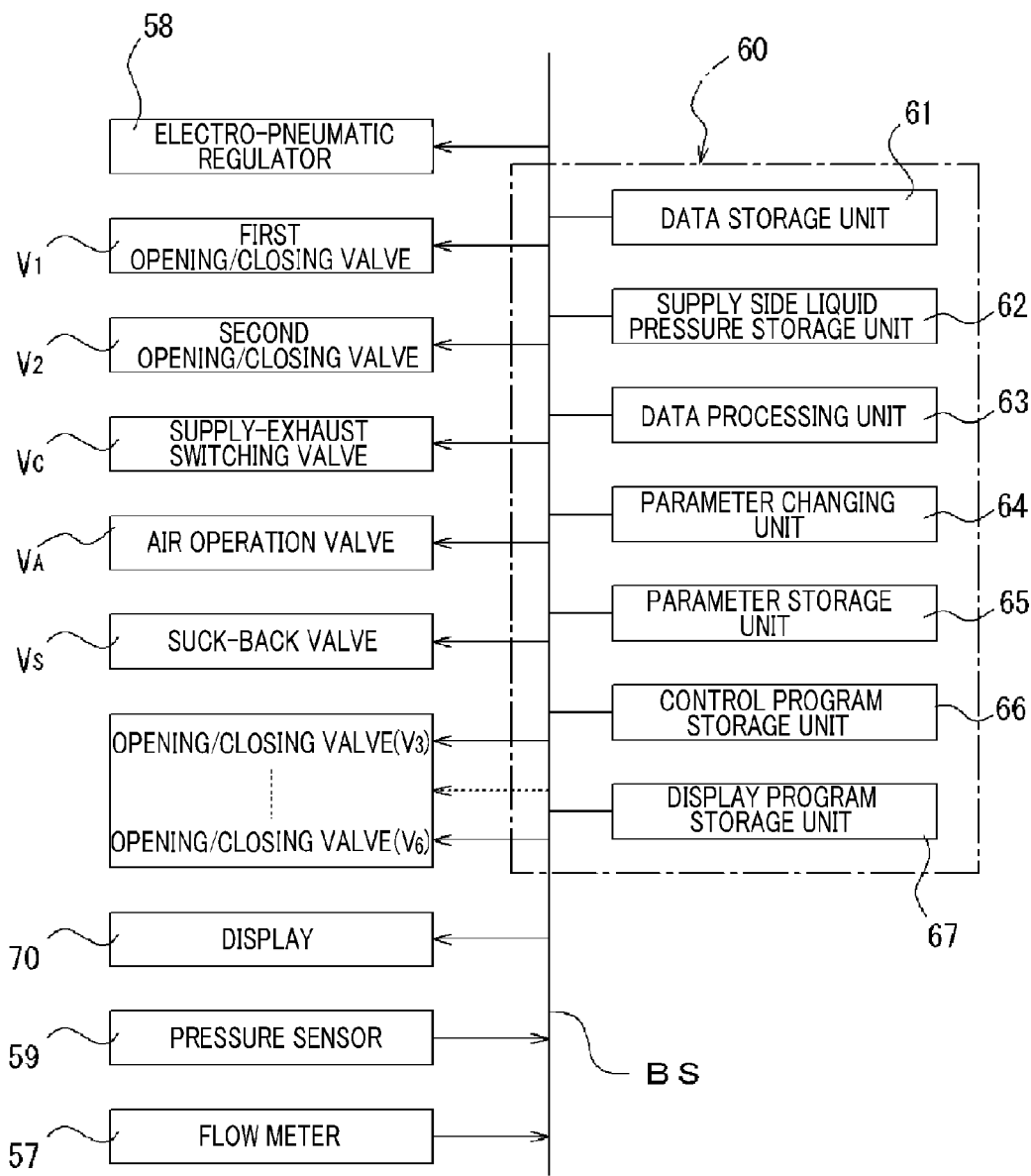
FIG. 6 is a block diagram illustrating a controller in the chemical liquid supply system in accordance with an illustrative embodiment.

As illustrated in FIG. 6, the controller 60 includes a data storage unit 61, a supply side liquid pressure storage unit 62, and a data processing unit 63. The data storage unit 61 stores therein pressure data in the operation chamber 53 of the chemical liquid pump 50 detected by the pressure sensor 59 or exhaust flow rate data in the passageway 56 detected by the flow meter 57. The supply side liquid pressure storage unit 62 stores therein a liquid pressure variation data at a first side of the chemical liquid pump 50. The data processing unit 63 calculates a compensated pressure value by comparing the data stored in the data storage unit 61 with the data stored in the supply side liquid pressure storage unit 62. More specifically, for example, the data processing unit 63 calculates the compensated pressure value based on the pressure detected by the pressure sensor 59 and the liquid pressure variation on the first side of the chemical liquid pump 50. The controller 60 also includes a parameter changing unit 64 and a parameter storage unit 65. Here, the parameter changing unit 64 changes parameters for an exhaust pressure and a supply pressure of the electro-pneumatic regulator 58 based on the data stored in the data storage unit 61 and the data stored in the supply side liquid pressure storage unit 62, and the data calculated in the data processing unit 63. Further, the parameter storage unit 65 stores therein the changed parameters.

The supply side liquid pressure stored in the supply side liquid pressure storage unit 62 varies depending on an arrangement position (height H1) of the chemical liquid bottle 13 or a liquid surface height H2 of the chemical liquid such as the resist solution in the chemical liquid bottle 13. The height H1 of the chemical liquid bottle 13 is previously measured when the chemical liquid bottle 13 is provided in the chemical units U7 or U8 of the processing system. The liquid surface height H2 of the resist solution in the chemical liquid bottle 13 varies depending on an amount discharged and the number of times of discharging the resist solution from the discharge nozzle 43. Here, the liquid surface height H2 may be calculated by using a total amount (about 3800 ml) of resist solution in newly provided chemical liquid bottle 13, an amount (about 0.55 ml) of the resist solution discharged at one time and the number of times of discharging the resist solution. The calculated supply side liquid pressure data are stored in the supply side liquid pressure storage unit 62. Also, factors of varying the supply side liquid pressure such as a type or viscosity of the chemical liquid (e.g., resist solution) are stored in the supply side liquid pressure storage unit 62.

The controller 60 also includes a control program storage unit 66 and a display program storage unit 67. Based on a control program, operations of the electro-pneumatic regulator 58, the first opening/closing valve $V_1$, the second opening/closing valve $V_2$, the opening/closing valves $V_3$ to $V_6$, the air operation valve $V_A$, the suck-back valve $V_S$ and the supply-exhaust switching valve $V_C$ are controlled. A signal from a display program is sent to a display 70. The reference numeral "BS" in FIG. 6 denotes a bus.

Subsequently, an operation of the chemical liquid supply system configured as described above will be explained by reference to FIGS. 7 and 8. In order to perform a first replenishment of the resist solution when the pump chamber 52 of the chemical liquid pump 50 is empty, in response to a signal from the controller 60, the first opening/closing valve $V_1$ is opened, the second opening/closing valve $V_2$ is closed, and the supply-exhaust switching valve $V_C$ is switched to a state for the exhaust. In this state, a pressure value in the operation chamber 53 of the chemical liquid pump 50 is detected by the pressure sensor 59. The detected pressure value is sent (inputted) to the controller 60. Subsequently, the electro-pneumatic regulator 58 is communicated with the depressurization source 55, and air in the operation chamber 53 is exhausted. In this case, an exhaust flow rate is detected by the flow meter 57, and a detection signal of the detected exhaust flow rate is sent (inputted) to the controller 60. At the same time of starting the air exhaustion in the operation chamber 53, the resist solution is simultaneously supplied from the supply passageway 44 into the pump chamber 52 to be replenished into the pump chamber 52.

Upon the completion of the resist solution replenishment, the first opening/closing valve $V_1$ is closed, and the supply-exhaust switching valve $V_C$ switches to a state for the shut-off. Subsequently, the second opening/closing valve $V_2$ is opened, and the supply-exhaust switching valve $V_C$ is switched to a state for the supply. Then, the electro-pneumatic regulator 58 is communicated with the pressurization source 54, and air is supplied into the operation chamber 53. Thus, the resist solution in the pump chamber 52 is discharged from the chemical liquid pump 50, and also discharged from the discharge nozzle 43 onto the wafer surface. In this way, the coating process is finished.

After the first replenishment of the resist solution, the replenishment and discharge of the resist solution into and from the pump chamber 52 of the chemical liquid pump 50 are repeatedly performed in the above-described manner, so that the resist solution is discharged from the discharge nozzle 43 onto the surface of the wafer. As a result, the coating process is performed on the wafer surface.

When the replenishment of the resist solution into the chemical liquid pump 50 of the chemical liquid supply system is started, there is generated a pressure difference between upstream front side and a back side of the first opening/closing valve $V_1$, i.e., a difference between a liquid pressure at the first side of the chemical liquid pump 50 and an air pressure in the operation chamber 53. Here, if the liquid pressure at the first side is greater than the air pressure in the operation chamber 53, an exhaust flow rate when the replenishment of the chemical liquid is started increases. As a result, excessive pressure fluctuation, i.e., overshoot (refer to FIG. 8(a)) occurs. Due to the overshoot, a flow rate of the resist solution into the pump chamber 52 increases, and a flow rate thereof also becomes faster. As a result, a filtering rate of the resist solution passing through the filter 46 becomes faster.

Here, if the filtering rate is faster than a maximum filtering rate of the filter 46, for example, about 0.3 ml/sec, there is a problem that impurities in the resist solution may pass through the filter 46 without being filtered. This problem can be prevented by reducing the difference between the liquid pressure at the first side of the chemical liquid pump 50 and the pressure in the operation chamber 53 when the replenishment of the chemical liquid into the chemical liquid pump 50 is started.

Accordingly, in the chemical liquid supply system in accordance with the above-described embodiment, a pressure in the operation chamber 53 when the replenishment of the chemical liquid into the chemical liquid pump 50 is started is detected by the pressure sensor 59, and an exhaust flow rate is detected by the flow meter 57. The detected pressure data and the detected exhaust flow rate data are sent (inputted) to the controller 60, and the electro-pneumatic regulator 58 is controlled based on a control signal from the controller 60 such that the pressure in the operation chamber 53 when the replenishment of the chemical liquid is started becomes equal to the liquid pressure at the first side of the chemical liquid pump 50.

An entire volume of the chemical liquid pump 50 is a sum of the volume of the pump chamber 52 and the volume of the operation chamber 53. Meanwhile, the volume of the operation chamber 53 is calculated based on an air exhaust flow rate and a pressure change in the operation chamber 53 when starting the replenishment. Therefore, the volume of the pump chamber 52 can be calculated. In this way, the replenishment control can be performed by calculating the volume of the pump chamber 52 and by checking a flow of the resist solution replenished into the pump chamber 52.

Hereinafter, the replenishment control will be described in detail. As explained above, since the entire volume of the chemical liquid pump 50 is a sum of the volume of the pump chamber 52 and the volume of the operation chamber 53, when the entire volume of the chemical liquid pump 50 denotes V, the volume of the pump chamber 52 denotes $VL_n$, and the volume of the operation chamber 53 denotes $VA_n$, $$V = VL_n + VA_n \quad (1).$$

From the formula (1), $$VL_n = V - VA_n \quad (2).$$

Since the volume of the operation chamber 53 varies depending on the volume of the pump chamber 52, a replenishment flow rate of the chemical liquid into the pump chamber 52 can be calculated based on an air exhaust flow rate in the operation chamber 53 and a flow rate in the operation chamber 53 caused by the pressure change. That is, when the replenishment flow rate is denoted by $QL_n$, the exhaust flow rate caused by a volume change of the operation chamber 53 is denoted by $QA_n$, and a flow rate in the operation chamber 53 caused by the pressure change is denoted by $QA_{n'}$, $QL_n$ can be expressed by the equation $QL_n = QA_n - QA_{n'}$.

The pressure at the first side of the chemical liquid pump 50 varies as time passes depending on a liquid pressure of a chemical liquid (resist solution) remaining in the chemical liquid bottle 13 or the number of the chemical liquid (resist solution) discharge. As a result, the flow rate $QA_{n'}$ in the operation chamber 53 caused by the pressure change can be calculated based on a change in the pressure at the first side of the chemical liquid pump 50. The flow rate $QA_{n'}$ is represented by the following equation:

$$QA_{n'} = VA_{n-1} \times \{(PA_{n-1})/101.325\}/\Delta t \quad (3)$$

$$VA_n = VA_{n-1} - QL_n \times \Delta t \quad (4)$$

In a normal status, $VA_n \gg QA_{n'}$.

Since the calculation of pressure or a flow rate represented by the formulas (3) and (4) cannot be consecutively carried out, the calculation is carried out in a sampling period. The sampling period is $\Delta t$.

Accordingly, n-th time = ((n−1)-th time) + $\Delta t$.

In the above formula, $VA_n$ denotes the volume of the operation chamber (pneumatic side) at the n-th time, $VA_{n-1}$ denotes the volume of the operation chamber (pneumatic side) at the (n−1)-th time, and $PA_{n-1}$ denotes a pressure in the operation chamber (pneumatic side) at the (n−1)-th time.

As described above, the volume of the operation chamber 53 is calculated based on an air exhaust flow rate and a pressure change in the operation chamber 53, so that the volume of the pump chamber 52 can be calculated. Accordingly, a flow of the resist solution replenished into the pump chamber 52 can be checked. Here, the overshoot is also checked by checking the flow of the resist solution replenished into the pump chamber 52. If overshoot occurs, the detected pressure data and the detected exhaust flow rate data are stored in the data storage unit 61 of the controller 60. Then, the data processing unit 63 calculates a compensated pressure value by comparing the data stored in the data storage unit 61 with the supply side liquid pressure variation previously stored in the supply side liquid pressure storage unit 62. Thereafter, based on the compensated pressure value changed by the parameter changing unit 64 and a control signal for an exhaust flow rate, the electro-pneumatic regulator 58 is controlled such that a pressure in the operation chamber 53 when the replenishment is started becomes equal to a liquid pressure at the first side of the chemical liquid pump 50. Desirably, the electro-pneumatic regulator 58 may be controlled at a filtering rate of the filter 46 so as not to deteriorate the function of the filter 46. As illustrated in FIG. 8(b), the electro-pneumatic regulator 58 may be controlled so as to obtain a flow rate $Q_B$ having deviation allowable for a reference flow rate $Q_A$ of the resist solution.

In the above-described embodiment, the supply side liquid pressure is previously stored in the supply side liquid pressure storage unit 62 of the controller 60. Here, the supply side liquid pressure varies depending on an arrangement position (height H1) of the chemical liquid bottle 13, a liquid surface height H2 of the chemical liquid (resist solution) in the chemical liquid bottle 13, and a type and viscosity of the chemical liquid (resist solution). Accordingly, when the first replenishment is started, by controlling a pressure in the operation chamber 53 of the chemical liquid pump 50 according to the liquid pressure at the first side, it is possible suppress overshoot caused by excessive pressure fluctuation.

When starting the replenishment of the chemical liquid into the chemical liquid pump 50 after the second time of the replenishment, the compensated pressure value can be calculated by using the detected pressure data and the detected exhaust flow rate data in the operation chamber 53 and the supply side liquid pressure variation data stored in the supply side liquid pressure storage unit 62 when the previous replenishment is started. Further, the replenishment of the chemical liquid can be controlled by changing the parameters for each replenishment. As a result, it is possible to improve the filtering accuracy of the filter 46.

In the above-described embodiment, chemical liquid (resist solution) in the chemical liquid bottle 13 is supplied to the discharge nozzle 43 and discharged from the discharge nozzle 43 by suction and discharge operation of the chemical liquid pump 50. However, the present disclosure is not limited thereto. By way of example, the chemical liquid supply method (system) of the illustrative embodiment may be applied to a case where a chemical liquid (resist solution) in the chemical liquid bottle 13 may be supplied to the discharge nozzle 43 and discharged from the discharge nozzle 43 by supplying a force-feed gas from a force-feed gas supply source onto a liquid surface of the chemical liquid bottle 13.

The above-described embodiment, the chemical liquid supply method (system) in accordance with the illustrative embodiment is applied to the resist coating process. However, the chemical liquid supply method (system) in accordance with the illustrative embodiment may be applied to a coating process using a chemical liquid rather than resist solution, and a liquid process using a chemical liquid other than the coating process.

What is claimed is:

1. A chemical liquid supply system comprising:
a filter for filtering a chemical liquid;
a chemical liquid pump, for performing suction and discharge of the chemical liquid according to a volume change of a pump chamber caused by a pressure change in an operation chamber partitioned by a flexible member from the pump chamber;
a first opening/closing valve provided at a first side of the chemical liquid pump;
a second opening/closing valve provided at a second side of the chemical liquid pump;
a pressure sensor for detecting a pressure in the operation chamber;
a flow rate sensor for detecting an exhaust flow rate;
a first pressure adjustment unit for adjusting an exhaust pressure; and
a controller for controlling the first pressure adjustment unit based on detected signals from the pressure sensor and the flow rate sensor, the controller including: a data storage unit for storing detected pressure data in the operation chamber and detected exhaust flow rate data; and a supply side liquid pressure data storage unit for storing liquid pressure variation data depending on a type and viscosity of the chemical liquid at the first side of the chemical liquid pump,
wherein the filter, the chemical liquid pump, the first opening/closing valve and the second opening/closing valve are provided in a chemical liquid passageway for connecting a chemical liquid discharge unit and a chemical liquid tank storing therein the chemical liquid,
the chemical liquid supplied from the chemical liquid tank is filtered by the filter according to opening/closing operations of the first and second opening/closing valves and a supply/exhaust operation of the chemical liquid pump, and then, the chemical liquid is discharged from the chemical liquid discharge unit,
the pressure sensor, the flow rate sensor and the first pressure adjustment unit are provided on a passage connected to the operation chamber of the chemical liquid pump,
the pressure sensor detects a pressure in the operation chamber when the first opening/closing valve is opened at a time of starting a replenishment of the chemical liquid into the chemical liquid pump,
the flow rate sensor detects an exhaust flow rate exhausted from the operation chamber,
when a first replenishment is started, the controller controls a pressure in the operation chamber to be equal to a liquid pressure at the first side of the chemical liquid pump, and
when a replenishment is started after a second time of the replenishment, a compensated pressure value is calculated by using the detected pressure data and the detected exhaust flow rate data stored in the data storage unit and the liquid pressure variation data depending on the type and the viscosity of the chemical liquid stored in the supply side liquid pressure data storage unit, and the controller controls the pressure in the operation chamber based on the calculated compensated pressure value, and
wherein the passage includes: a main passage connected to the operation chamber of the chemical liquid pump; an exhaust passage branched from the main passage and connected to a depressurization source; and a pressurization passage branched from the main passage and connected to a pressurization source,
the flow rate sensor is provided on the main passage,
the first pressure adjustment unit is provided on the exhaust passage,
a second pressure adjustment unit is provided on the pressurization passage,
the first pressure adjustment unit and the second pressure adjustment unit are combined to each other as a combined pressure adjustment unit,
the pressure sensor is provided in the combined pressure adjustment unit,
the controller is configured to control said exhaust pressure and a pressing pressure of the combined pressure adjustment unit, and
the combined pressure adjustment unit includes: a common communication block selectively connected with the exhaust passage or the pressurization passage; two stop blocks configured to block communication between the main passage and the exhaust passage or communication between the main passage and the pressurization passage; and an electromagnetic switching unit configured to control a switching operation between the common communication block and the two stop blocks.

* * * * *